(12) United States Patent
Gajapathy

(10) Patent No.: US 7,907,468 B2
(45) Date of Patent: Mar. 15, 2011

(54) MEMORY DEVICE HAVING DATA PATHS PERMITTING ARRAY/PORT CONSOLIDATION AND SWAPPING

(75) Inventor: Partha Gajapathy, Highland Village, TX (US)

(73) Assignee: Micron Technology, Inc., Boise, ID (US)

( * ) Notice: Subject to any disclaimer, the term of this patent is extended or adjusted under 35 U.S.C. 154(b) by 70 days.

(21) Appl. No.: 12/128,165

(22) Filed: May 28, 2008

(65) Prior Publication Data

US 2009/0296443 A1 Dec. 3, 2009

(51) Int. Cl.
*G11C 8/00* (2006.01)

(52) U.S. Cl. ............ 365/230.05; 365/230.03; 365/72; 365/63; 365/51

(58) Field of Classification Search .......... 365/72, 365/63, 51, 230.03, 230.05
See application file for complete search history.

(56) References Cited

U.S. PATENT DOCUMENTS

| | | | |
|---|---|---|---|
| 5,040,144 A * | 8/1991 | Pelley et al. | 365/51 |
| 5,546,349 A | 8/1996 | Watanabe et al. | |
| 5,909,388 A | 6/1999 | Mueller | |
| 5,923,605 A | 7/1999 | Mueller et al. | |
| 6,084,816 A | 7/2000 | Okamura | |
| 6,157,560 A | 12/2000 | Zheng | |
| 6,549,442 B1 | 4/2003 | Lu et al. | |
| 6,741,513 B2 | 5/2004 | Hönigschmid et al. | |
| 6,742,098 B1 * | 5/2004 | Halbert et al. | 711/172 |
| 6,999,372 B2 * | 2/2006 | Takayanagi | 365/230.05 |
| 7,010,656 B2 | 3/2006 | Gupta | |
| 7,054,178 B1 | 5/2006 | Shiah et al. | |
| 7,126,853 B2 * | 10/2006 | Kim | 365/185.11 |
| 7,196,941 B2 * | 3/2007 | Lee et al. | 365/189.04 |
| 7,272,070 B2 | 9/2007 | Hummler | |
| 7,417,911 B2 * | 8/2008 | Kuroda | 365/203 |
| 2004/0190364 A1 * | 9/2004 | Jung | 365/230.05 |
| 2006/0023483 A1 | 2/2006 | Lee et al. | |
| 2006/0133186 A1 | 6/2006 | Hummler | |
| 2009/0103390 A1 * | 4/2009 | Kim et al. | 365/230.05 |

FOREIGN PATENT DOCUMENTS

WO WO 2006/066897 A1 6/2006

* cited by examiner

*Primary Examiner* — Andrew Q Tran
(74) *Attorney, Agent, or Firm* — Knobbe Martens Olson & Bear LLP

(57) ABSTRACT

Apparatus and methods are disclosed, such as those involving array/port consolidation and/or swapping. One such apparatus includes a plurality of port pads including a plurality of contacts; a plurality of memory arrays; and a plurality of master data lines. Each of the master data lines extends in a space between one of the port pads and a respective one of the memory arrays. Each of the master data lines is electrically connectable to the contacts of a respective one of the port pads. The apparatus further includes a plurality of local data lines, each of which extends over a respective one of the memory arrays. Each of the local data lines is electrically connectable to a respective one of the master data lines. At least one of the local data lines extends over at least two of the memory arrays. This configuration allows memory array consolidation and/or swapping without increasing die space for additional routing and adversely affecting performance of the apparatus.

15 Claims, 7 Drawing Sheets

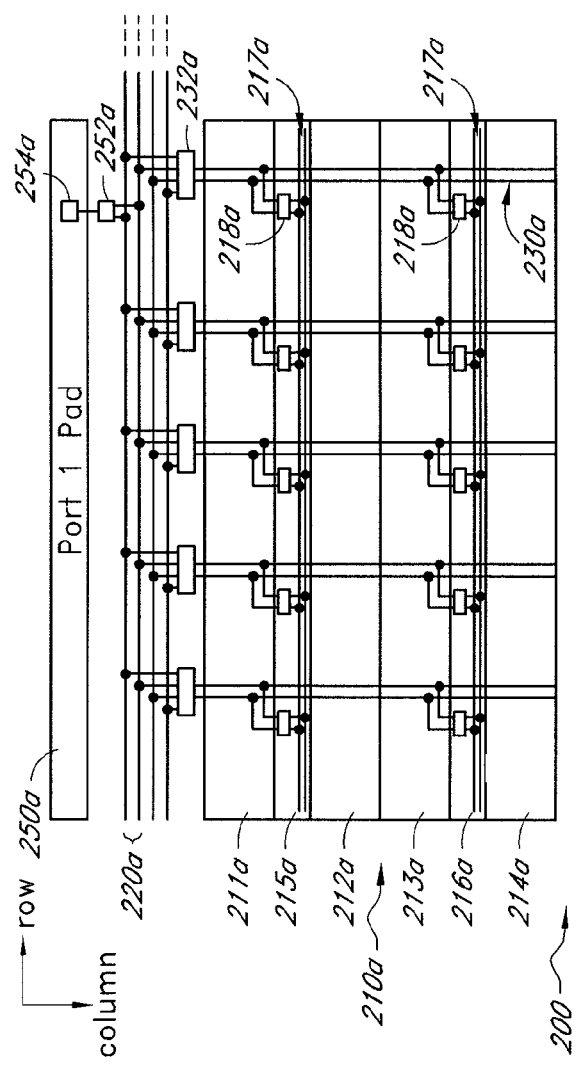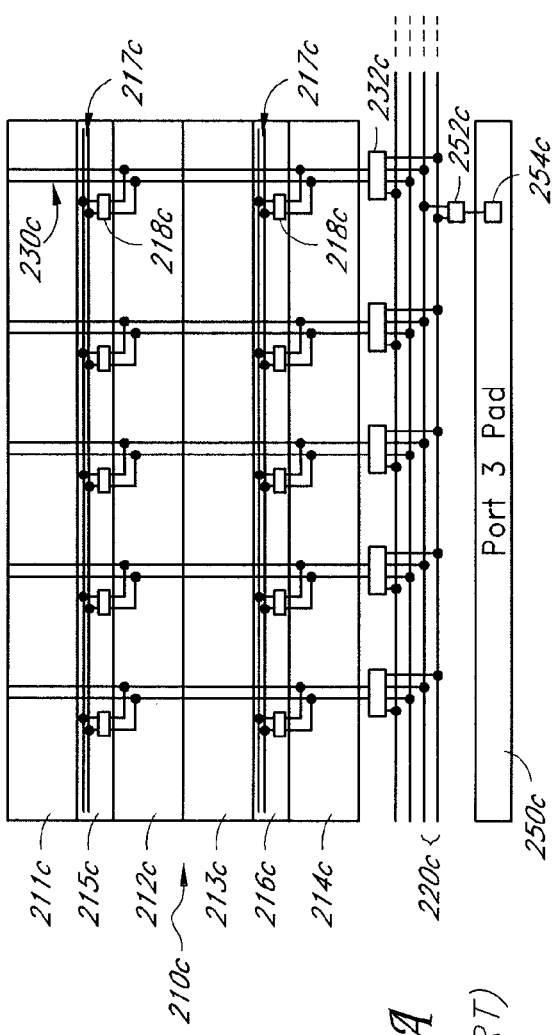
FIG. 2
| FIG. 2A | FIG. 2B |
FIG. 2A
(PRIOR ART)

| FIG. 2A |
| FIG. 2B |

MEMORY DEVICE HAVING DATA PATHS PERMITTING ARRAY/PORT CONSOLIDATION AND SWAPPING

BACKGROUND OF THE INVENTION

1. Field of the Invention

Embodiments of the invention relate to memory devices, and more particularly, in one or more embodiments, to data routing in memory devices.

2. Description of the Related Art

Memory devices typically include one or more memory arrays and ports for allowing an external device to access the memory arrays. Various routing schemes have been developed to provide transfer data between memory arrays and ports within a memory device.

FIGS. 1A and 1B (hereinafter, collectively referred to as FIG. 1) are a schematic plan view of a memory device employing a conventional routing scheme. The illustrated memory device 100 is a dynamic random access memory (DRAM). The illustrated portion of the memory device 100 includes first to fourth memory arrays 110a-110d, first to fourth master data line (MDL) pairs 120a-120d, and first to fourth port pads 150a-150d. A port pad and a circuit connected to the port pad for data input and output form a port. The illustrated portion can be repeated in the memory device 100, depending on the design of the memory device 100.

Each of the memory arrays 110a-110d has a first bank 111a-111d, a second bank 112a-112d, a third bank 113a-113d, a fourth bank 114a-114d, a first midgap 115a-115d, a second midgap 116a-116d, and local data line (LDL) pairs 130a-130d. The four banks 111a-114a, 111b-114b, 111b-114b, 111b-114b in each memory array 110a-110d extend parallel to one another in a row direction, as drawn in FIG. 1. A column direction is substantially perpendicular to the row direction, as drawn in FIG. 1. Each of the banks includes memory cells (for example, 8,192×256 or 16,384×512 cells) in a matrix form.

In the illustrated memory device 100, the first midgap 115a-115d of each memory array 110a-110d is positioned between the first bank 111a-111d and the second bank 112a-112d. The second midgap 116a-116d of each memory array 110a-110d is positioned between the third bank 113a-113d and the fourth bank 114a-114d. The first and second midgaps 115a-115d, 116a-116d run parallel to the four banks 111a-114a, 111b-114b, 111b-114b, 111b-114b in the row direction.

Each of the midgaps 115a-115d, 116a-116d includes a local midgap data line pair 117a-117d and a plurality of midgap switches 118a-118d. Each of the local midgap data line pairs 117a-117d includes two conductive lines extending in the row direction. The midgap switches 118a-118d serve to selectively make electrical connection between the local midgap data line pairs 117a-117d and the local data line pairs 130a-130d. The midgap switches 118a-118d are aligned with one another in the row direction within the same midgap. The midgap switches 118a-118d are also aligned in the column direction with the midgap switches in another midgap. For example, the midgap switches 118a in the first midgap 115a-115d are aligned in the column direction with the midgap switches 118a in the second midgap 116a-116d. The local midgap data line pairs 117a-117d and the local data line pairs 130a-130d together form data paths from the master data lines 120a-120d to memory cells in the banks, or vice versa during a read or write operation.

The local data line pairs 130a-130d serve to transfer data between the banks of one of the memory arrays 110a-110d and a respective one of the master data lines 120a-120d. The local data line pairs 130a-130d extend across the four banks and the midgaps in the column direction in one of the memory arrays 110a-110d. In the illustrated device 100, each of the local data line pairs 130a-130d includes two conductive lines. The local data line pairs 130a-130d are electrically coupled to the midgap switches 118a-118d aligned in the column direction within a memory array 110a-110d.

Each of the first to fourth port pads 150a-150d includes a group of contacts 154a-154d. The group of contacts in a port pad can form a row or line. The contact can include a pad or input/output pad. In FIG. 1, each port pad 150a-150d is shown to include only one contact 154a-154d for simplicity, but each port pad 150a-150d includes more contacts depending on the design of the memory device. In the example shown, the contacts 154a-154d serve to provide electrical connection between the master data lines 120a-120d and an external device (not shown). Each of the contacts 154a-154d is formed of a conductive material. The number of the contacts 154a-154d per port pad may be selected based at least partially on the data input/output scheme that the memory device 100 employs. The contacts 154a-154d together provide data signals (e.g., representing bits) to the external device, or receive data signals from the external device.

The master data line pairs 120a-120d serve to transfer data between the local data line pairs 130a-130d and a respective one of the contacts 154a-154d. Each of the master data line pairs 120a-120d includes two conductive lines positioned between one of the port pads 150a-150d and a respective one of the memory arrays 110a-110d, extending in the row direction. The two conductive lines of a master data line pair run substantially parallel to each other and are electrically separated from each other. The master data line pairs 120a-120d are electrically separated from one another. Although FIG. 1 depicts the memory device 100 as including one pair of master data lines between a port pad and a memory array, the memory device 100 can include additional pairs of master data lines between the port pad and the memory array. Each of the additional pairs of master data lines is electrically connectable to a respective one of the contacts of the port pad via a pad switch.

The memory device 100 also includes a plurality of local data line switches 132a-132d. The local data line switches 132a-132d are positioned between one of the master data line pairs 120a-120d and an adjacent one of the memory arrays 110a-110d, and are aligned in the row direction. Each of the local data line switches 132 selectively provides electrical connection between one of the local data line pairs 130a-130d and the adjacent one of the master data lines 120a-120d.

The memory device 100 also includes a plurality of pad switches 152a-152d. Each of the pad switches 152a-152d selectively provides electrical connection between one of the master data line pairs 120a-120d and a respective one of the contacts 154a-154d. Each of the contacts 154a-154d is electrically coupled to a respective one of the pad switches 152a-152d. Each of the master data line pairs 120a-120d may be electrically coupled to one or more of pad switches adjacent to a respective port pad.

Although not illustrated, the memory device 100 may further include other components, for example, an address register, a column decoding circuit, a row decoding circuit, a data input/output circuit, a bank control logic circuit, and sense amplifiers.

During operation, the switches 118a-118d, 132a-132d, 152a-152d are selectively turned on to transfer data to or from memory cells at selected addresses of the memory arrays 110a-110d. In the conventional arrangement, because each memory array is electrically connectable to the contacts of only one of the port pads, data stored in a memory cell of a memory array cannot be output via the contacts of another port pad. In addition, data provided to the contacts of one of the port pads can be stored only in a memory array that is electrically connectable to the contacts of the port pad, but not any other memory arrays.

BRIEF DESCRIPTION OF THE DRAWINGS

The embodiments will be better understood from the Detailed Description of Embodiments and from the appended drawings, which are meant to illustrate and not to limit the embodiments, and wherein.

DETAILED DESCRIPTION OF EMBODIMENTS

In memory devices including a plurality of memory arrays (for example, the memory device of FIG. 1), each memory array is electrically connectable to a single port. To enhance memory usage and/or flexibility with the given memory capacity, array/port consolidation and swapping schemes have been proposed. Array/port consolidation refers to a routing scheme in which one port can access two or more memory arrays or one memory array can be accessed via two or more ports. In a memory device employing such a consolidation scheme, data digits input via different ports can be stored in the same memory array. Alternatively, data digits stored in a memory array can be output via different ports. Array/port swapping refers to a routing scheme where two ports, each of which has an access to a memory array, can swap their access to the memory arrays with each other.

Figures 2, 2B:
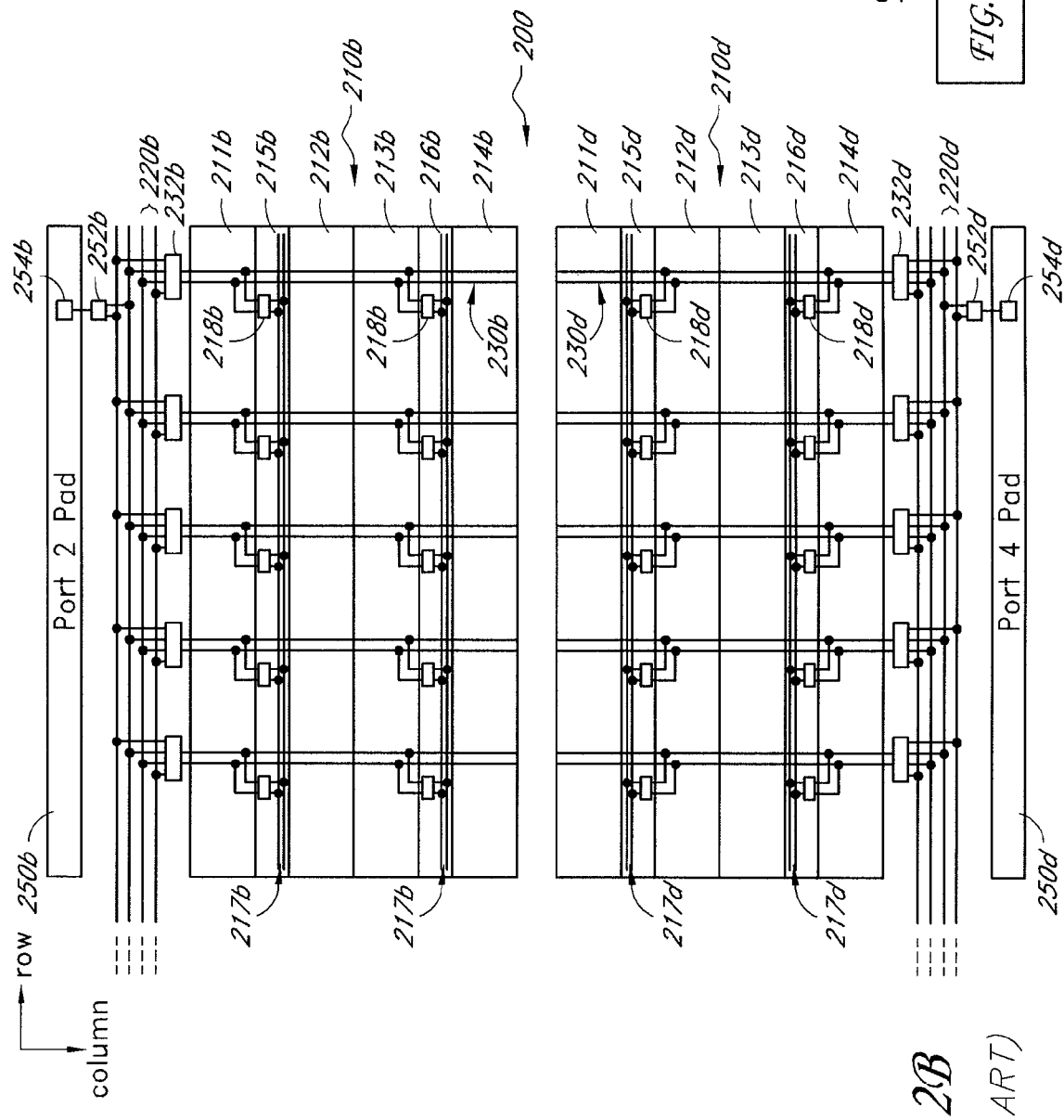
FIG. 2 consists of FIGS. 2A and 2B and is a schematic plan view of a memory device including another conventional data line layout for array/port consolidation/swapping.

FIG. 2 is a schematic plan view of another conventional memory device employing an array/port consolidation/swapping scheme. The illustrated memory device is a dynamic random access memory (DRAM). The illustrated portion of the memory device 200 includes first to fourth memory arrays 210a-210d, first to fourth master data line (MDL) pairs 220a-220d, and first to fourth port pads 250a-250d. The illustrated portion can be repeated in the memory device 200.

Each of the memory arrays 210a-210d may have first to fourth banks 211a-214a, 211b-214b, 211c-214c, 211d-214d, a first midgap 215a-215d, a second midgap 216a-216d, local midgap data line pairs 217a-217d, midgap switches 218a-218d, and a plurality of local data line (LDL) pairs 230a-230d. The configurations of the foregoing components can be as described above with respect to those of FIG. 1.

Each of the first to fourth port pads 250a-250d includes a group of contacts 254a-254d. The group of contacts in a port pad can form a row or line. In FIG. 2, each port pad 250a-250d is shown to include only one contact 254a-254d for simplicity, but each port pad 250a-250d includes more contacts depending on the design of the memory device. The contacts 254a-254d serve to provide electrical connection between the master data line pairs 220a-220d and an external device (not shown). The number of the contacts 254a-254d may vary, depending at least partly on the data input/output scheme that the memory device 200 employs.

Each of the master data line pairs 220a-220d serves to provide electrical connection between one of the contacts 254a-254d and the local data line pairs 230a-230d of two of the memory arrays 210a-210d. Each of the master data line pairs 220a-220d includes two conductive lines that extend substantially parallel to each other, and are electrically separated from each other. Although FIG. 2 depicts the memory device 200 as including two pairs of master data lines between a port pad and a memory array, the memory device 200 can include additional pairs of master data lines between the port pad and the memory array. Each of the additional pairs of master data lines is electrically connectable to a respective one of the contacts of the port pad via a pad switch.

The two conductive lines of each of the master data line pairs 220a-220d extend in a space between one of the port pads 250a-250d and a respective one of the memory arrays 210a-210d in a row direction as denoted in FIG. 2. The two conductive lines of each of the master data line pairs 220a-220d further extend in the row direction into another space between an adjacent port pad and an adjacent memory array. The adjacent port pad is positioned immediately next to the one port pad in the row direction. The adjacent memory is also positioned immediately next to the one memory array in the row direction. For example, the first master data line pair 220a extends in a space between the first port pad 250a and the first memory array 210a, and further in another space between the second port pad 250b and the second memory array 210b. Thus, two master data line pairs are adjacent to each other in the spaces, extending parallel to each other. The two adjacent master data line pairs 220a-220d are electrically separated from each other, and extend parallel to each other. For example, the first and second master data line pairs 220a, 220b extend parallel to each other, while being electrically separated from each other. Similarly, the third and fourth master data line pairs 220c, 220d extend parallel to each other, while being electrically separated from each other.

The memory device 200 also includes a plurality of local data line switches 232. Each of the local data line switches 232a-232d selectively provides electrical connection between one of the local data line pairs 230a-230d and one of two adjacent master data line pairs 220a-220d. For example, a local data line switch 232a positioned between the first memory array 210a and the first and second master data line pairs 220a, 220b may selectively connect a local data line pair 230a of the first memory array 210a to the first or second master data line pairs 220a, 220b.

The memory device 200 also includes first to fourth pad switches 252a-252d electrically coupled to the first to fourth contacts 254a-254d, respectively. Each of the pad switches 252a-252d selectively provides electrical connection between one of the master data line pairs 220a-220d and a respective one of the contacts 254a-254d. In the illustrated device, each of the first to fourth pad switches 252a-252d selectively connects one of the first to fourth master data line pairs 220a-220d to a respective one of the first to fourth contacts 254a-254d. Each of the master data line pairs 220a-220d may be electrically coupled to one or more of pad switches adjacent to a respective port pad.

During operation, the switches 218a-218d, 232a-232d, 252a-252d described above are selectively turned on to transfer data to or from memory cells of the memory arrays at selected addresses of the memory arrays 210a-210d. Because a memory array 210a-210d can have data paths to the contacts of two adjacent port pads (for example, the first and second port pads 250a, 250b), data stored in a memory cell of a memory array may be output via the contacts of either of the two adjacent port pads. Alternatively, data provided to the contacts of a port pad can be stored in either of two adjacent memory arrays. This configuration allows array/port consolidation and/or swapping.

The memory device 200, however, uses additional space for the master data line pairs 220a-220d because two master data line pairs per contact should be formed between the port pads 250a-250d and the memory arrays 210a-210d. Such requirement for an additional space is an obstacle to reducing the size of the memory device 200. In addition, this layout may increase a time delay on a data path because of the doubled length of the master data lines 220a-220d compared to the master data lines 120a-120d of the memory device 100 of FIG. 1. In other words, the doubled length of the master data lines 220a-220d increases a time delay for a signal to be toggled from one end of the line to the other end, thereby adversely affecting the performance of the memory device 200. Therefore, there is a need for a memory device layout that neither requires an additional space nor increases a time delay, while permitting array/port consolidation and/or swapping.

In one embodiment, a memory device includes a plurality of memory arrays, a plurality of port pads, a plurality of master data lines, and a plurality of local data lines. Each of the master data lines is positioned between one of the memory arrays and a respective one of the port pads, and is electrically connectable to the contacts of the one of the port pads. Each of the local data lines crosses at least two of the memory arrays while being electrically connectable to a respective one of the master lines. In this manner, data can be read from or written into memory cells in either of the at least two memory arrays via the contacts of a port pad electrically coupled to the one master line. This configuration permits array/port consolidation and/or swapping.

In addition, the configuration does not necessarily require an additional space because there is no required increase in the number of master data lines between the port pads and the memory arrays. Although the number of local data lines in each memory array might be doubled compared to the conventional memory devices of FIGS. 1 and 2, an additional space is not necessarily required for the additional local data lines because the local data lines can be formed at a vertical level that has room for the additional lines.

Figure 3A:
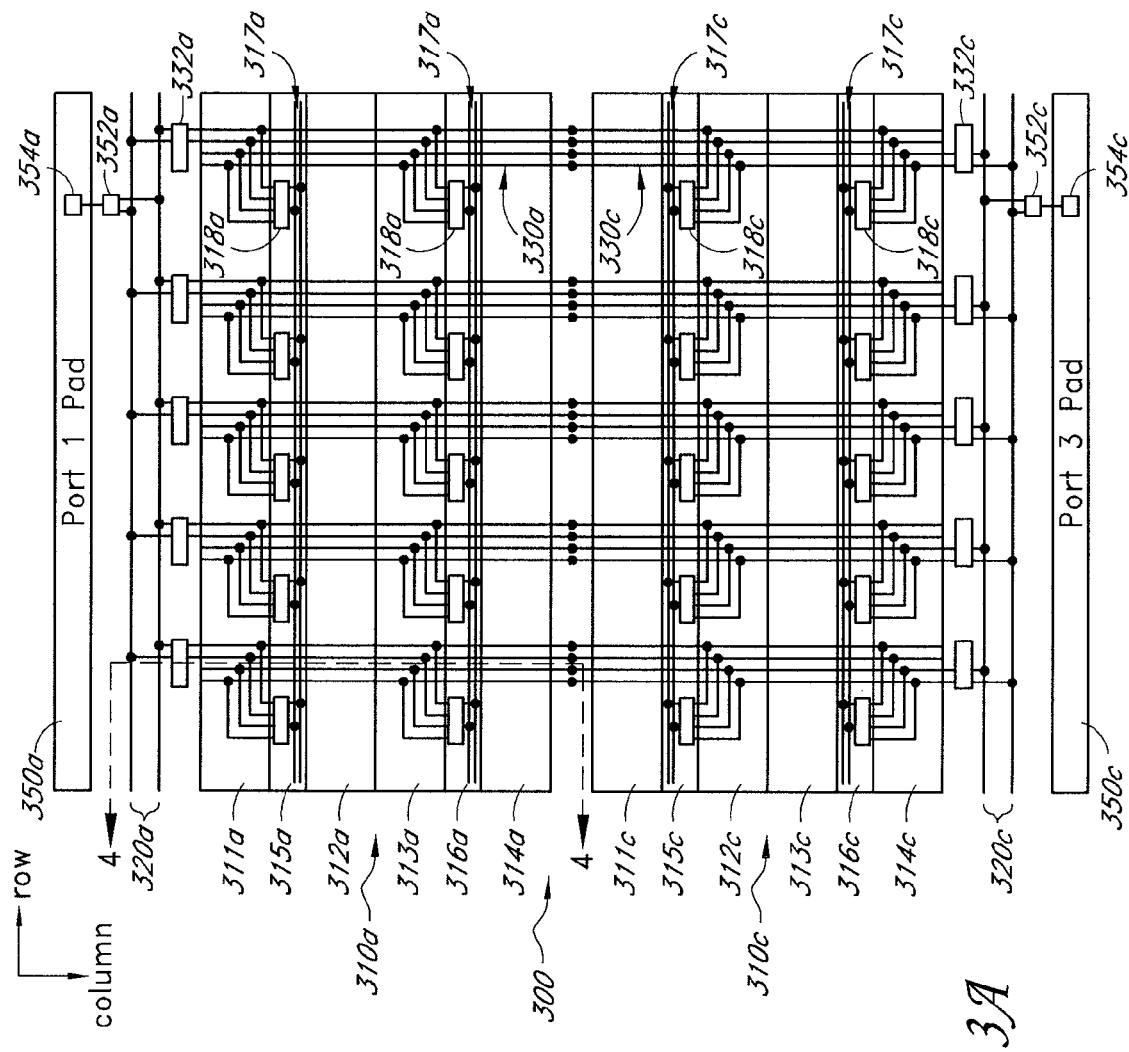
FIG. 3 consists of FIGS. 3A and 3B and is a schematic plan view of a memory device including a data line layout for array/port consolidation/swapping according to one embodiment.
Figure 3B:
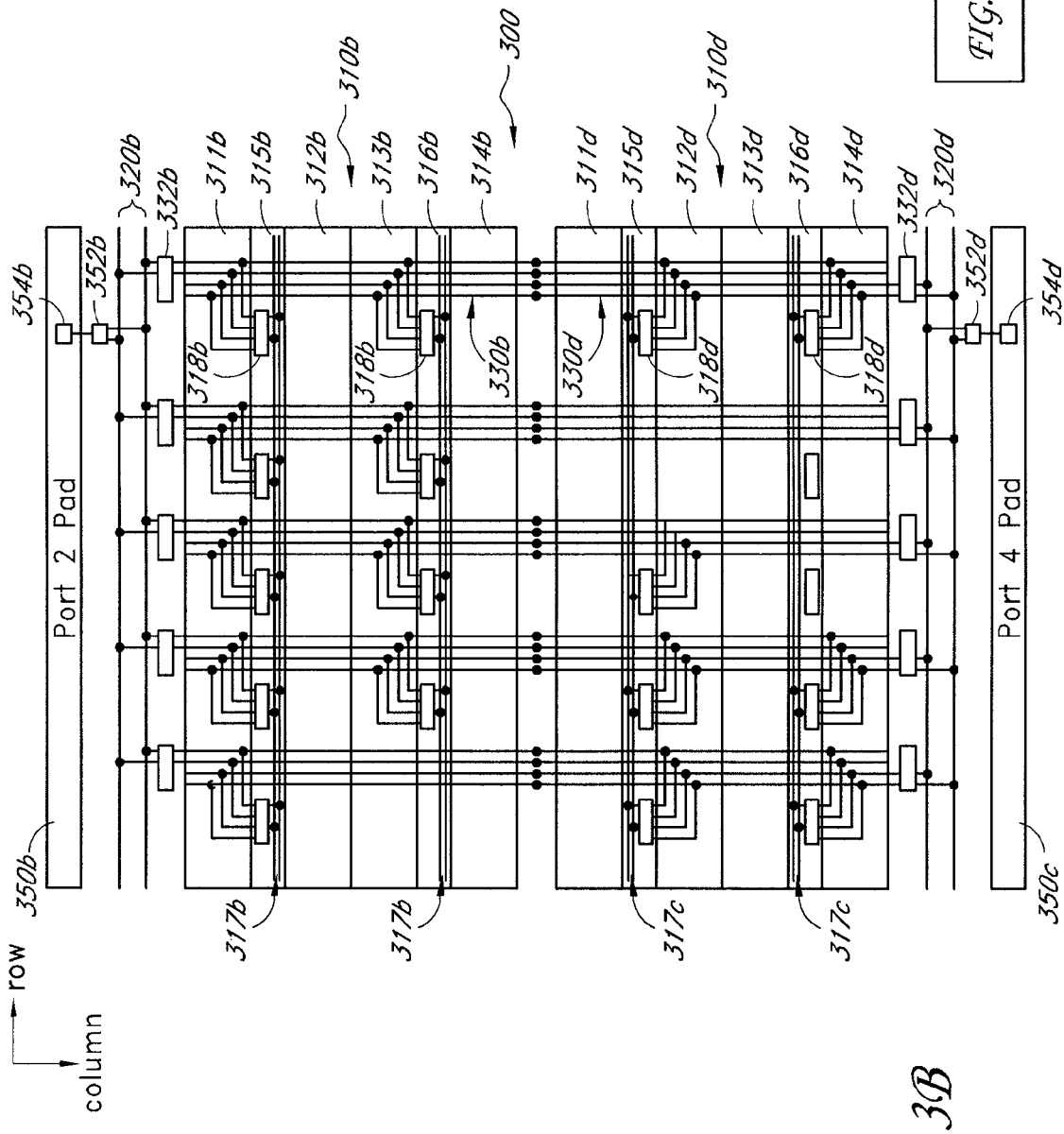

Referring to FIG. 3, a memory device including a data line layout according to one embodiment will be now described. In the illustrated embodiment, the memory device 300 is a DRAM. In other embodiments, the memory device can be any other type of solid state memory.

The illustrated portion of the memory device 300 includes first to fourth memory arrays 310a-310d, first to fourth master data line (MDL) pairs 320a-320d, and first to fourth port pads 350a-350d. The memory arrays 310a-310d form two rows in a row direction as shown in FIG. 3. The port pads 350a-350d also form two rows in the row direction. Each of the master data lines 320a-320d is positioned between a respective one of the memory arrays 310a-310d and a respective one of the port pads 350a-350d. The portion can be repeated in the memory device 300.

Each of the memory arrays 310a-310d may have first to fourth banks 311a-314a, 311b-314b, 311c-314c, 311d-314d, a first midgap 315a-315d, a second midgap 316a-316d, and a plurality of local data line (LDL) pairs 330a-330d. The four banks 311a-314a, 311b-314b, 311c-314c, 311d-314d in a memory array 310a-310d extend parallel to one another in the row direction. Details of the banks 311a-314a, 311b-314b, 311c-314c, 311d-314d can be as described above in connection with the banks of FIG. 1.

Each of the midgaps 315a-315d, 316a-316d may include local midgap data line pairs 317a-317d and midgap switches 318a-318d. Each of the local midgap data line pairs 317a-317d includes two conductive lines extending in the row direction. The midgap switches 318a-318d are configured to selectively make electrical connection between the local midgap data line pairs 317a-317d and the local data line pairs 330a-330d. The midgap switches 318a-318d are aligned with one another in the row direction within the same midgap. Midgap switches 318a-318d in one midgap may also be aligned in the column direction with midgap switches in another midgap in the same memory array. The local midgap data line pairs 317a-317d and the local data line pairs 330a-330d together form data paths between the master data line pairs 320a-320d and memory cells in the memory arrays 310a-310d during a read or write operation.

The local data line pairs 330a-330d extend in the column direction across the first to fourth banks 311a-314a, 311b-314b, 311c-314c, 311d-314d and the midgaps 315a-315d, 316a-316d of one memory array 310a-310d. In the illustrated embodiment, each of the local data line pairs 330a-330d includes two conductive lines. In other embodiments, the local data line pairs 330a-330d may be replaced with any suitable number of conductive lines, depending on the memory device architecture. In one embodiment, each of the local data lines 330a-330d may have a width of about 12 μm to about 16 μm. The two conductive lines of a local data line pair 330a-330d may be spaced about 16 μm from each other.

The memory device 300 also includes local data line switches 332a-332d that are positioned between one of the master data line pairs 320a-320d and an adjacent one of the memory arrays 310a-310d, and are arranged in the row direction. Each of the local data line pairs 330a-330d is electrically coupled to one of the master data line pairs 320a-320d via one of the local data line switches 332a-332d. For example, a local data line pair 330a extending from the first memory array 310a is electrically connectable to the first master data line 320a via the local data line switch 332a positioned between the first memory array 310a and the first master data line 320a.

Each of the local data line pairs 330a-330d further extends in the column direction across the first to fourth banks and the midgaps of another memory array neighboring the one memory array in the column direction. For example, local data line pairs 330a in the first memory array 310a further extend in the column direction across the third memory array 310c that neighbors the first memory array 310a in the column direction. Similarly, local data line pairs 330c in the third memory array 310c further extend in the column direction across the first memory array 310a. In the illustrated embodiment, the two local data line pairs 330a, 330c extending from the neighboring memory arrays are parallel to each other, and are positioned close to each other, as shown in FIG. 3. In other embodiments, the spacing between these local data line pairs 330a, 330c extending from the neighboring memory arrays may be different from that shown in FIG. 3.

In addition, the two local data line pairs 330a, 330c extending from the neighboring memory arrays are electrically connectable to the same local midgap data line pairs 317a-317d via the same midgap switches 318a-318d. In the illustrated embodiment, for example, the four conductive lines of the two local data line pairs 330a, 330c are electrically coupled to the same midgap switches 318a, 318c in the first and third memory arrays 310a, 310c. In other embodiments, the two local data line pairs 330a, 330c extending from the neighboring memory arrays may be provided with separate switches for accessing the same local midgap data line pairs 317a-317d.

Each of the first to fourth port pads 350a-350d includes a group of contacts 354a-354d. The group of contacts in a port pad can form a row or line. In FIG. 3, each port pad 350a-350d is shown to include only one contact 354a-354d for simplicity, but each port pad 350a-350d includes more contacts depending on the design of the memory device. The contacts 354a-354d serve to provide electrical connection between the master data line pairs 320a-320d and an external device (not shown). The number of the contacts 354a-354d per port pad may vary, depending at least partly on the data input/output scheme that the memory device 300 employs.

Each of the master data line pairs 320a-320d provides electrical connection between one of the contacts 354a-354d and respective ones of the local data line pairs 330a-330d. Each of the master data line pairs 320a-320d is positioned between one of the port pads 350a-350d and a respective one of the memory arrays 310a-310d, and extends in the row direction. The master data line pairs 320a-320d run substantially parallel to each other, and are electrically separated from one another. Although FIG. 3 depicts the memory device 300 as including a pair of master data lines between a port pad and a memory array, the memory device 300 can include additional pairs of master data lines between the port pad and the memory array. Each of the additional pairs of master data lines is electrically connectable to a respective one of the contacts of the port pad via a pad switch.

The memory device 300 may also include a plurality of pad switches 352a-352d. Each of the pad switches 352a-352d selectively provides electrical connection between one of the master data lines 320a-320d and a respective one of the contacts 354a-354d. In the illustrated embodiment, each of the master data line pairs 320a-320d may be electrically coupled to one or more of pad switches adjacent to a respective port pad. A skilled artisan will appreciate that some of the components described above may have different configurations or may be omitted.

Although not illustrated, the memory device 300 may further include other components, for example, an address register, a column decoding circuit, a row decoding circuit, a data input/output circuit, a bank control logic circuit, sense amplifiers. A skilled artisan will appreciate that these components can be located at any suitable positions with or without altering the layout depicted in FIG. 3.

During operation, the aforementioned switches 318a-318d, 332a-332d, 352a-352d are selectively turned on to transfer data between the memory cells in the memory arrays 310a-310d and the contacts 354a-354d. For example, data stored in a memory cell in the first memory array 310a can be transferred to the contact 354a of the first port pad 350a via a data path formed by a local midgap data line pair 317a in the first memory array 310a, a local data line pair 330a crossing the first memory array 310a, and the first master data line pair 320a. Alternatively, the data can be transferred to the contact 354c of the third port pad 350c via another data path formed by the local midgap data line pair 317a in the first memory array 310a, another local data line pair 330c crossing the first and third memory arrays 310a, 310c, and the third master data line 320c. Similarly, data can be written into a memory cell in a memory array via the contacts of either of the two port pads. In this manner, data can be transferred to or from a memory array via the contacts of either of two available port pads. Similarly, data provided to a port can be transferred to the contacts of either of two available memory arrays.

The configuration described above allows the memory device 300 to be used with bank consolidation and/or swapping schemes. For example, two data digits input via the contacts of the first and third port pads 350a, 350c can be simultaneously stored in the first memory array 310a (array/port consolidation). Alternatively, two data digits stored in the first memory array 310a can be output via the contacts of the first and third port pads 350a, 350c (array/port consolidation). In other instances, a data digit can be stored in the first memory array 310a via one of the contacts 354c of the third port pad 350c while another data digit can be stored in the third memory array 310c via one of the contacts 354a of the first port pad 350a (array/port swapping).

The end-to-end lengths of the master data line pairs 320a-320d are relatively shorter than that of the master data lines 220a-220d of the memory device of FIG. 2. Thus, this layout does not significantly increase a time delay on data paths, and thus the performance of the memory device 300 should not be adversely affected, compared to the memory device of FIG. 2.

Figure 4:
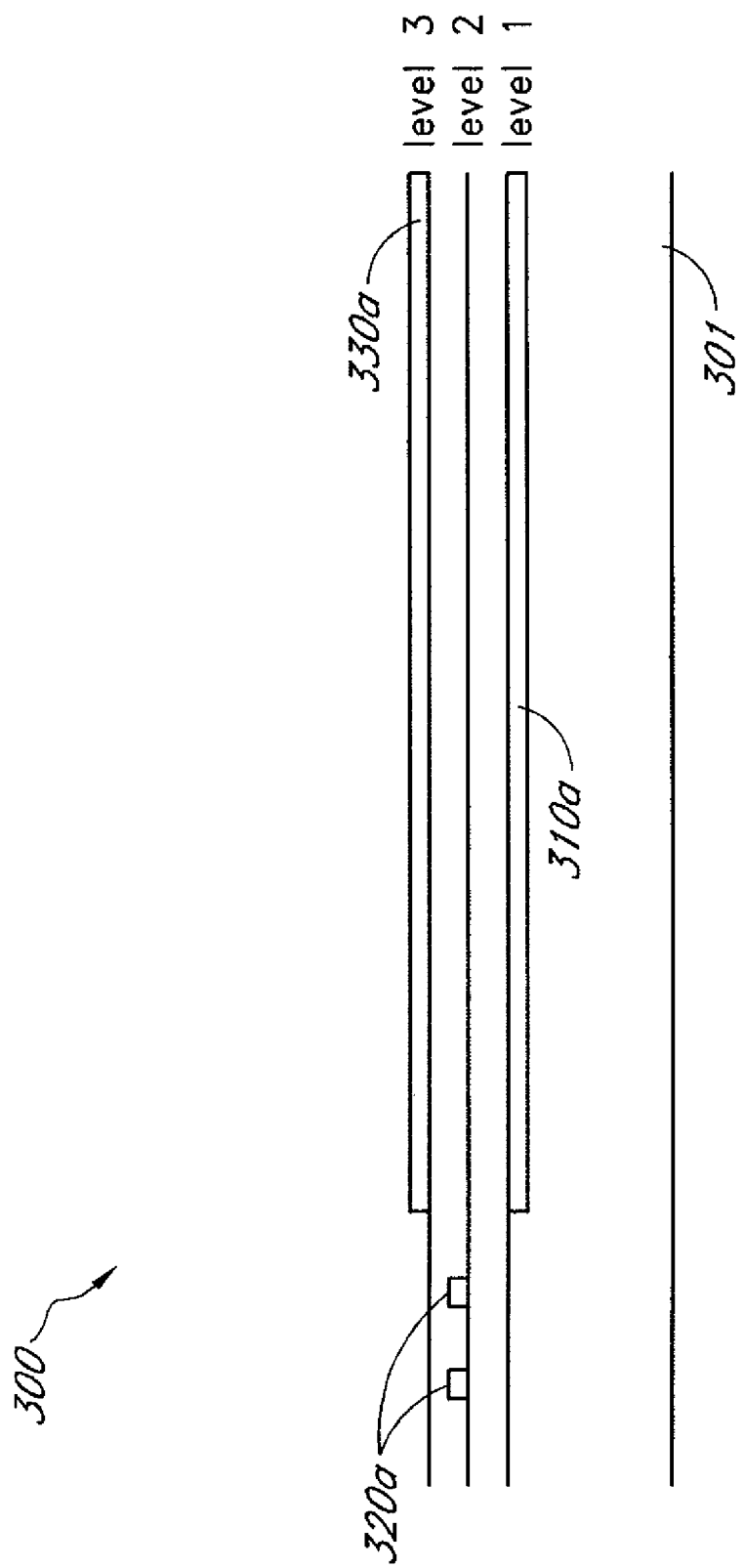
FIG. 4 is a cross section of a memory device of FIG. 3, taken along lines 4-4.

Referring to FIG. 4, a cross-section of the memory device according to one embodiment will be now described. The memory device 300 includes a substrate 301, the first memory array 310a at a first vertical level over the substrate 301, the first master data line pair 320a at a second vertical level, and one of the local data line pairs 330a, 330c at a third vertical level. The second vertical level is higher than the first vertical level, and the third vertical level is higher than the second vertical level.

Figure 1A:
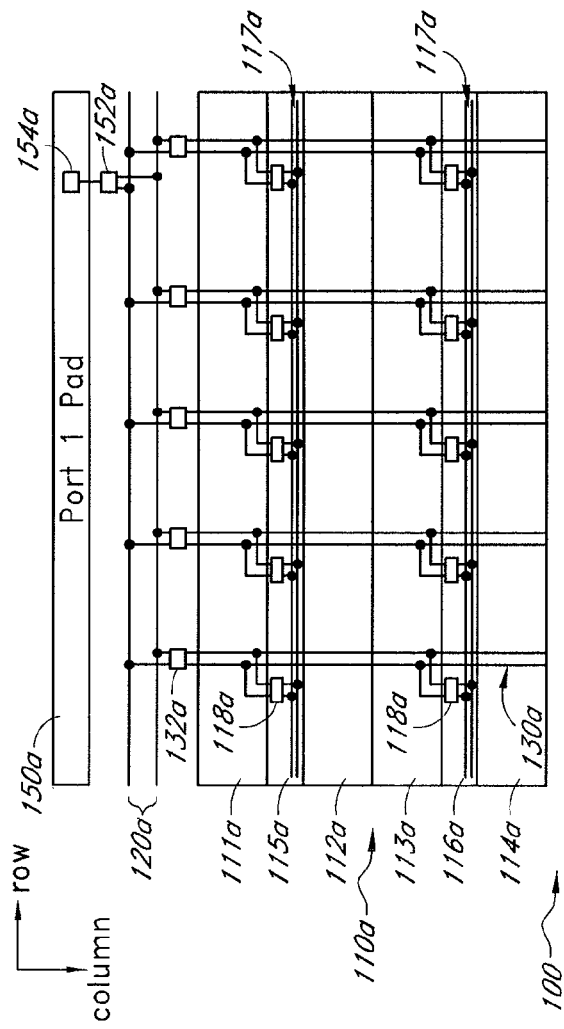
FIG. 1 consists of FIGS. 1A and 1B and is a schematic plan view of a memory device including a conventional data line layout.
Figure 1A:
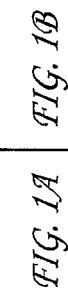
Figure 1B:
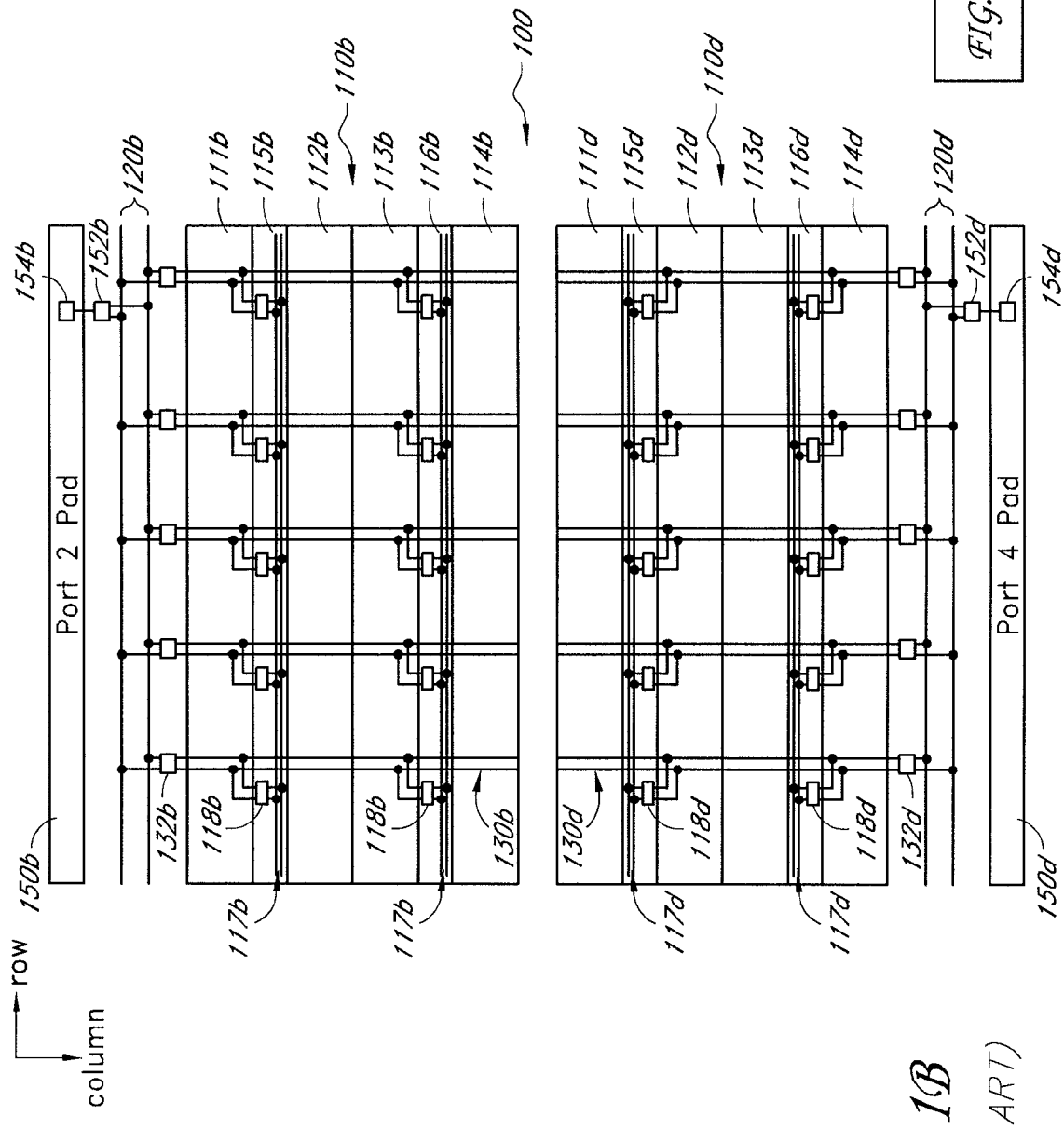

Each memory array 310a-310d of the memory device 300 of FIG. 3 includes twice as many local data line pairs 330a-330d as each memory array 110a-110d, 210a-210d of the memory devices 100, 200 of FIGS. 1 and 2. However, in one embodiment, these additional local data line pairs in each memory array do not require an additional lateral die space because they can be formed at a vertical level, such as the third level, that typically has available space for additional lines.

The embodiment above is described in connection with a memory device including two rows of memory arrays and two rows of port pads. In other embodiments, the layout described above can be adapted for memory devices including more than two rows of memory arrays and more than two rows of port pads. For example, a memory device can include a matrix of 3×3 or more memory arrays and port pads surrounding the matrix. In such an embodiment, the memory device can include local data lines crossing three or more memory arrays. A skilled artisan will appreciate that the configurations of local data lines can be adapted for various array/port layouts to achieve array/port consolidation and/or swapping.

The embodiments described above can be adapted for various memory devices, for example, a random access memory (RAM) and a flash memory. The random access memory can include, but is not limited to, a DRAM. The memory devices can also include a dual port RAM. Such memory devices can be part of various electronic devices. Examples of the electronic devices can include, but are not limited to, consumer electronic products, electronic circuits, electronic circuit components, parts of the consumer electronic products, electronic test equipments, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

One embodiment is an apparatus including: a plurality of contacts for input/output; a plurality of memory arrays configured to store data; and a plurality of master data lines. Each of the master data lines extends in a space between a respective contact and a respective memory array. Each of the master data lines is electrically connectable to the respective contact. The apparatus also includes a plurality of local data lines. Each of the local data lines extends over a respective one of the memory arrays. Each of the local data lines is electrically connectable to a respective one of the master data lines. At least one of the local data lines extends over at least portions of two of the memory arrays.

Another embodiment is a memory device including: a first memory array; a first contact adjacent to a first edge of the first memory array; a second contact located opposite to the first edge of the first memory array, but not necessarily adjacent to the first memory array; a first local data line configured to carry data between the first memory array and the first contact; and a second local data line configured to carry data between the first memory array and the second contact.

Yet another embodiment is a method of operating a memory device having a first data path between a first contact and a first memory cell in a first memory array. The first data path includes a first master data line and a first local data line. The first master data line is electrically connectable to the first contact. The first local data line is electrically connectable to the first master data line and the first memory cell. The method includes transferring data between the first memory cell and a second contact different from the first contact via a second data path. The second data path includes a second master data line different from the first master data line, and a second local data line different from the first local data line. The second master data line is electrically connectable to the second contact. The second local data line is electrically connectable to the second master data line and the first memory cell.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

I claim:

1. An apparatus comprising:
a plurality of memory arrays configured to store data, wherein the plurality of memory arrays comprises a first memory array and a second memory array adjacent to each other;
a plurality of groups of contacts for input/output of data to/from the plurality of memory arrays, wherein each of the contacts for input/output is disposed outside of an outline for a respective memory array, wherein the plurality of groups of contacts comprises a first group of contacts and a second group of contacts such that the first and second memory arrays are interposed between the first and second groups of contacts;
a plurality of master data lines, each of the master data lines extending in a space between a respective group of contacts for input/output and a side of a respective memory array, each of the master data lines being electrically connectable to a respective contact of the respective group, wherein the plurality of master data lines comprises a first master data line extending in a first space between the first group of contacts and a side of the first memory array, and a second master data line extending in a second space between the second group of contacts and a side of the second memory array; and
a plurality of local data lines, each of the local data lines extending over at least a respective one of the memory arrays, each of the local data lines being electrically connectable to a respective one of the master data lines, wherein at least one of the local data lines extends over at least portions of two of the memory arrays, wherein the plurality of local data lines comprises a first local data line extending over the first and second memory arrays, and a second local data line extending over the first and second memory arrays, wherein the first local data line is electrically connectable to the first master data line, but not to the second master data line, wherein the second local data line is electrically connectable to the second master data line, but not to the first local data line;
wherein a local data line is configured to carry data to and from a portion of a memory array and a master data line;
wherein a master data line is configured to carry data to and from a local data line and a contact for input/output.

2. The apparatus of claim 1, wherein the at least one of the local data lines is electrically connectable to the at least two of the memory arrays.

3. The apparatus of claim 1, wherein all of the local data lines extend across at least two of the memory arrays.

4. The apparatus of claim 3, wherein all of the local data lines extend across respective two of the memory arrays, the respective two memory arrays being positioned adjacent to each other.

5. The apparatus of claim 1, wherein each of the master data lines does not extend into a space between another of the groups and another of the memory arrays.

6. The apparatus of claim 5, wherein the plurality of memory arrays are aligned to form first and second rows in a first direction, wherein the plurality of groups of contacts are aligned to form first and second lines in the first direction, the first and second rows of the memory arrays being positioned between the first and second lines, the first row of memory arrays being positioned between the first line and the second row of memory arrays.

7. The apparatus of claim 6, wherein each of the plurality of master data lines extend in the first direction between the first row of memory arrays and the first line, or between the second row of memory arrays and the second line.

8. The apparatus of claim 7, wherein at least one of the local data lines extends over the first and second rows of memory arrays in a second direction substantially perpendicular to the first direction.

9. The apparatus of claim 8, wherein the first and second local data lines are spaced closer to each other than to the other local data lines.

10. The apparatus of claim 9, wherein each of the first and second memory arrays further comprises a plurality of banks and one or more midgaps between two of the banks, the banks and midgaps extending in the first direction,
wherein each of the first and second memory arrays further comprises one or more midgap lines extending in the first direction in the midgaps, and wherein the first and second local data lines are electrically connectable to the midgap lines.

11. The apparatus of claim 10, wherein each of the first and second memory arrays further comprises midgap switches electrically coupled to the midgap lines and to the first and second local data lines.

12. The apparatus of claim 11, wherein the number of local data lines electrically coupled to a midgap switch is greater than the number of midgap lines electrically coupled to the midgap switch.

13. The apparatus of claim 12, wherein each of the midgap switches are electrically coupled to four local data lines and two midgap lines such that each of the midgap switches selectively couples less than all of the four local data lines to the midgap lines.

14. The apparatus of claim 12, wherein two of the four local data lines are electrically coupled to a first pair of master data lines extending in the first space, but not to a second pair of master data lines extending in the second space, wherein the other two of the four local data lines are electrically coupled to the second pair of master data lines, but not to the first pair of master data lines.

15. The apparatus of claim 1, wherein the memory arrays, the master data lines, and the local data lines are formed at a first vertical level, a second vertical level, and a third vertical level, respectively, the first vertical level being lower than the second vertical level, the second vertical level being lower than the third vertical level.

* * * * *